(12) United States Patent
Cheon et al.

(10) Patent No.: US 12,283,650 B2
(45) Date of Patent: Apr. 22, 2025

(54) DISPLAY DEVICE

(71) Applicant: Samsung Display Co., LTD., Yongin-si (KR)

(72) Inventors: Soohong Cheon, Seoul (KR); Hyungjin Song, Hwaseong-si (KR); Seongyoung Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 495 days.

(21) Appl. No.: 17/698,425

(22) Filed: Mar. 18, 2022

(65) Prior Publication Data

US 2022/0376153 A1 Nov. 24, 2022

(30) Foreign Application Priority Data

May 20, 2021 (KR) .................. 10-2021-0064803

(51) Int. Cl.
 *H01L 33/62* (2010.01)
 *H01L 27/15* (2006.01)
 *H01L 33/38* (2010.01)
 *H01L 33/40* (2010.01)

(52) U.S. Cl.
 CPC ............ *H01L 33/62* (2013.01); *H01L 27/156* (2013.01); *H01L 33/382* (2013.01); *H01L 33/40* (2013.01)

(58) Field of Classification Search
 CPC .... G09G 2300/0404–0465; H10K 59/10–124; H10K 59/35–353; H01L 27/1214–1255; H01L 33/36–387; H01L 33/40; H01L 33/62; H01L 33/00–648; H01L 27/15–156
 See application file for complete search history.

(56) References Cited

U.S. PATENT DOCUMENTS

| | | | |
|---|---|---|---|
| 2015/0206933 A1* | 7/2015 | Koshihara | G09G 3/3225 257/40 |
| 2019/0181156 A1* | 6/2019 | Kim | H01L 25/5226 |
| 2020/0143743 A1* | 5/2020 | Toya | H10K 59/131 |

FOREIGN PATENT DOCUMENTS

KR 10-1859474 5/2018

* cited by examiner

*Primary Examiner* — Amar Movva
*Assistant Examiner* — Eric Manuel Mulero Flores
(74) *Attorney, Agent, or Firm* — KILE PARK REED & HOUTTEMAN PLLC

(57) ABSTRACT

A display device includes an active pattern, a gate electrode, a gate signal line, and a light emitting diode. The active pattern is disposed on a substrate. The gate electrode is disposed on the active pattern and overlaps the active pattern in a plan view. The gate electrode defines a channel area in an area overlapping the active pattern in a plan view. The gate signal line is disposed on the gate electrode. The gate signal line overlaps the channel area in a plan view. The gate signal line transmits a gate signal to the gate electrode. The light emitting diode is disposed on the gate signal line.

22 Claims, 8 Drawing Sheets

DISPLAY DEVICE

CROSS-REFERENCE TO RELATED APPLICATION(S)

This application claims priority to and benefits of Korean Patent Application No. 10-2021-0064803 under 35 U.S.C. § 119, filed on May 20, 2021 in the Korean Intellectual Property Office, the entire contents of which are incorporated herein by reference.

BACKGROUND

1. Technical Field

The disclosure relates generally to a display device. The disclosure relates to a display device that provides visual information.

2. Description of the Related Art

A cathode ray tube (CRT) television, which is one of types of display devices, has been widely used with many advantages in terms of performance and price. The CRT television has disadvantages in terms of miniaturization or portability. As technology improves, display devices having smaller sizes, lighter weight, and superior performance have been produced. For example, a plasma display device, a liquid crystal display device, an organic light emitting display device, and a quantum dot display device having advantages such as miniaturization, light weight, and low power consumption are attracting attention.

To have superior performance in the display device, a number of components included in the display device are increasing. However, the miniaturization of the display device may be achieved only in case that the components are arranged or disposed within a limited area. Accordingly, there is a need for a method for improving the efficiency of the area of the display device.

The above information disclosed in this background section is only for understanding of the background of the disclosure, and, therefore, it may contain information that may not constitute a prior art.

SUMMARY

Embodiments provide a display device with improved display quality.

According to an embodiment, a display device may include an active pattern disposed on a substrate; a gate electrode disposed on the active pattern and defining a channel area in an area overlapping the active pattern in a plan view; a gate signal line disposed on the gate electrode, overlapping the channel area in a plan view, and transmitting a gate signal to the gate electrode; and a light emitting diode disposed on the gate signal line.

According to an embodiment, the gate signal line may overlap the gate electrode in a plan view.

According to an embodiment, the gate electrode and the gate signal line may extend in a same direction.

According to an embodiment, the active pattern may extend in a first direction, and the gate electrode and the gate signal line may extend in a second direction intersecting the first direction.

According to an embodiment, the display device may further include an insulating layer disposed between the gate electrode and the gate signal line. The gate signal line may electrically contact the gate electrode through a contact hole penetrating the insulating layer.

According to an embodiment, the contact hole may be spaced apart from the active pattern in a plan view.

According to an embodiment, the display device may further include a source line electrically contacting the active pattern, the source line and the gate signal line may be disposed on a same layer.

According to an embodiment, the source line and the gate signal line may extend in a same direction.

According to an embodiment, the display device may further include a first insulating layer disposed between the active pattern and the gate electrode; and a second insulating layer disposed between the gate electrode and the gate signal line. The source line may be electrically connected to the active pattern through a contact hole penetrating the first insulating layer and the second insulating layer.

According to an embodiment, the display device may further include a capacitor including a first electrode, the first electrode and the gate electrode being disposed on a same layer; and a second electrode and the gate signal line being disposed on a same layer.

According to an embodiment, a length of the gate signal line may be longer than a length of the gate electrode.

According to an embodiment, the gate electrode and the gate signal line may contain a same material.

According to an embodiment, the gate electrode and the gate signal line may contain copper.

According to an embodiment, the light emitting diode may include a pixel electrode; an intermediate layer; and a counter electrode, the pixel electrode, the intermediate layer, and the counter electrode may be disposed sequentially on the gate signal line.

According to an embodiment, the display device may further include a data line disposed between the substrate and the active pattern. The data line may extend in a first direction. The gate electrode may extend in a second direction intersecting the first direction.

According to an embodiment, a display device may include a first active pattern disposed on a substrate; a second active pattern disposed on a same layer as the first active pattern, a first gate electrode disposed on the first active pattern and defining a first channel area in an area overlapping the first active pattern in a plan view; a second gate electrode defining a second channel area in an area overlapping the second active pattern in a plan view, the first gate electrode and the second gate electrode being disposed on a same layer; a first gate signal line disposed on the first gate electrode, overlapping the first channel area in a plan view, and transmitting a first gate signal to the first gate electrode; a second gate signal line transmitting a second gate signal to the second gate electrode, the second gate signal line and the first gate signal line being disposed on a same layer; and a light emitting diode disposed on the first gate signal line and the second gate signal line.

According to an embodiment, the first active pattern and the second active pattern may be spaced apart from each other.

According to an embodiment, the second gate signal line may be spaced apart from the second channel area in a plan view.

According to an embodiment, all of the first gate electrode may overlap the first gate signal line in a plan view. A portion of the second gate electrode may overlap the second gate signal line in a plan view.

According to an embodiment, the second gate electrode may include a first portion extending in a first direction and a second portion extending in a second direction intersecting the first direction. The first gate electrode, the first gate signal line, and the second gate signal line may extend in the second direction.

The display device may include a gate electrode and a gate signal line that transmits a gate signal to the gate electrode. Since the gate electrode and the gate signal line overlap and extend in the same direction, efficiency of a pixel area may be improved.

For example, the total area of the pixel may be reduced. The pixel per inch (PPI) of the pixel may be increased. The resolution of the display device may be increased. The display quality of the display device may be improved.

It is to be understood that both the foregoing general description and the following detailed description are examples that are intended to provide further explanation of the disclosure.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description explain the disclosure. In the drawings.

DETAILED DESCRIPTION OF THE EMBODIMENTS

Figure 1:
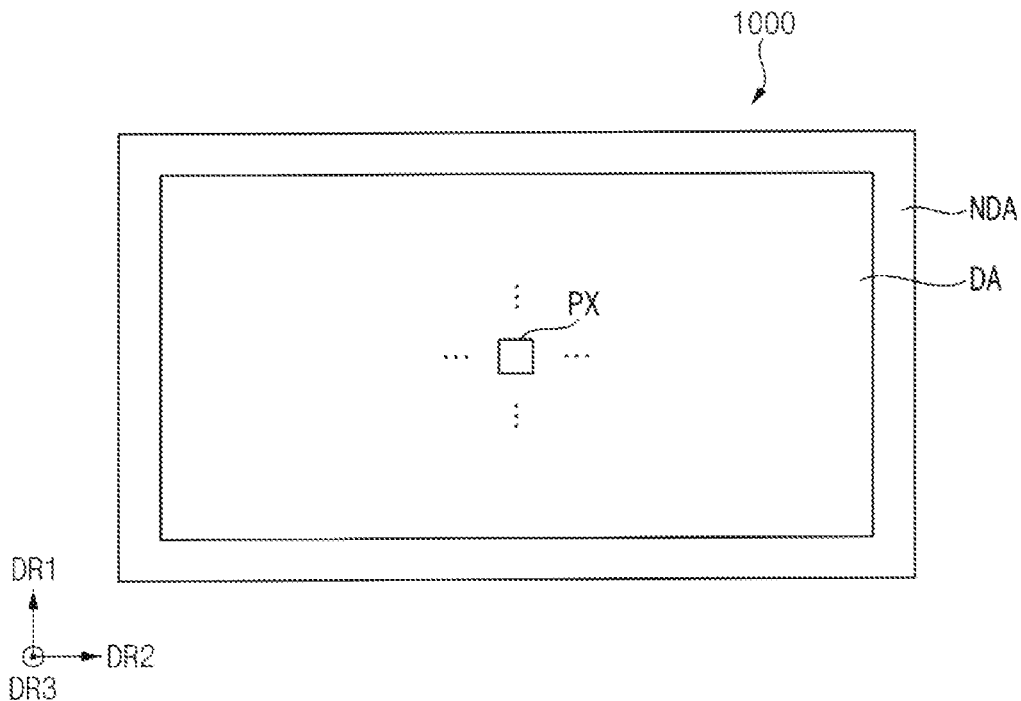
FIG. 1 is a schematic plan view illustrating a display device according to an embodiment.

Illustrative, non-limiting embodiments of the disclosure will be more clearly understood from the following detailed description in conjunction with the accompanying drawings.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

FIG. 1 is a schematic plan view illustrating a display device 1000 according to an embodiment.

Referring to FIG. 1, a plane may be defined in a first direction DR1 and a second direction DR2 intersecting the first direction DR1. The first direction DR1 may be perpendicular to the second direction DR2. A third direction DR3 may be perpendicular to the plane.

The display device 1000 may be divided into a display area DA and a non-display area NDA. The non-display area NDA may surround or may be adjacent to the display area DA. The display device 1000 may have a rectangular shape or a substantially rectangular shape, but the disclosure is not limited thereto.

A pixel PX may be disposed in the display area DA. As the pixel PX emits light, the display area DA may display an image.

Drivers may be disposed in the non-display area NDA. The drivers may include a scan driver and a data driver. The drivers may be electrically connected to the pixel PX. The drivers may provide various signals and voltages for the pixel PX to emit the light.

Figure 2:
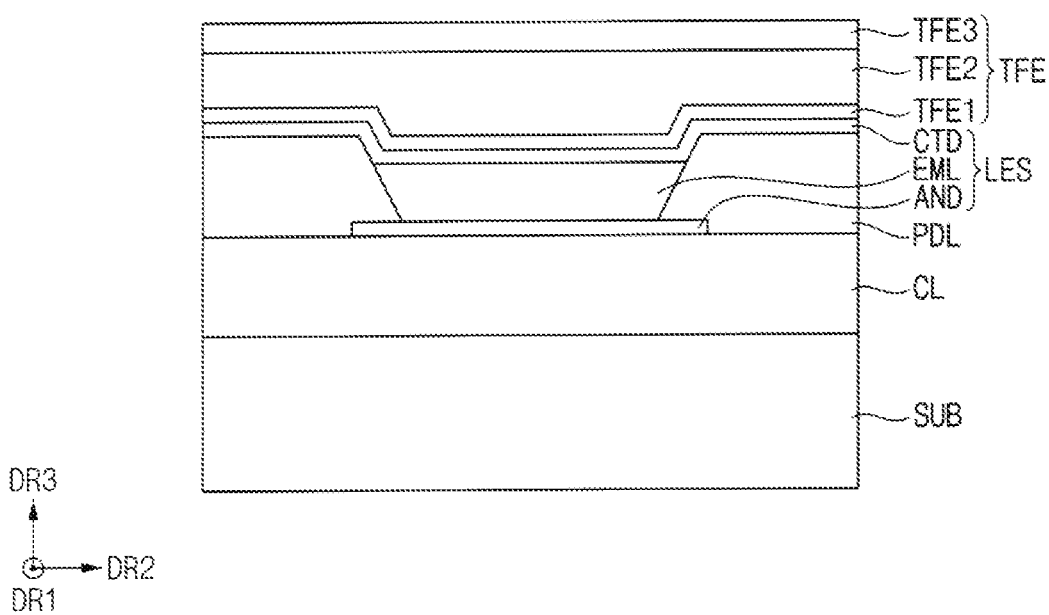
FIG. 2 is a schematic diagram illustrating an embodiment of a cross-section of the display device of FIG. 1.

FIG. 2 is a schematic diagram illustrating an embodiment of a cross-section of the display device 1000 of FIG. 1. For example, FIG. 2 may illustrate a cross section of the display area DA.

Referring to FIG. 2, the display device 1000 may include a substrate SUB, a circuit layer CL, and a light emitting diode LES. The display device 1000 may further include a pixel defining layer PDL and an encapsulation layer TFE.

The substrate SUB may be a glass substrate, a quartz substrate, a plastic substrate, or the like within the spirit and the scope of the disclosure. In case that the substrate SUB is the plastic substrate, the substrate SUB may contain a material having flexible, bendable, foldable, rollable, or stretchable properties.

The circuit layer CL may be disposed on the substrate SUB. The circuit layer CL may provide signals and voltages for the light emitting diode LES to emit light.

The light emitting diode LES and the pixel defining layer PDL may be disposed on the circuit layer CL. The light emitting diode LES may include a pixel electrode AND, an intermediate layer EML, and a counter electrode CTD that are sequentially disposed.

The pixel electrode AND may receive the various signals and voltages from the circuit layer CL. In an embodiment, the pixel electrode AND may be an anode electrode. In an embodiment, the pixel electrode AND may be a cathode electrode.

The pixel defining layer PDL may be disposed on the pixel electrode AND. The pixel defining layer PDL may have an opening exposing the pixel electrode AND. The pixel defining layer PDL may define each pixel PX emitting light by having the opening.

The intermediate layer EML may be disposed on the pixel electrode AND exposed by the pixel defining layer PDL. The intermediate layer EML may be disposed in the opening of the pixel defining layer PDL. The intermediate layer EML may include materials for emitting light. For example, the intermediate layer EML may include an organic light emitting material or an inorganic light emitting material.

The counter electrode CTD may be disposed on the intermediate layer EML and the pixel defining layer PDL. In an embodiment, the counter electrode CTD may be a cathode electrode. In an embodiment, the counter electrode CTD may be an anode electrode.

The encapsulation layer TFE may be disposed on the light emitting diode LES. The encapsulation layer TFE may protect the light emitting diode LES from external oxygen and moisture. The encapsulation layer TFE may include at least one inorganic layer. For example, the encapsulation layer TFE may include a first inorganic layer TFE1 disposed on the counter electrode CTD, an organic layer TFE2 disposed on the first inorganic layer TFE1, and a second inorganic layer TFE3 disposed on the organic layer TFE2.

Figure 3:
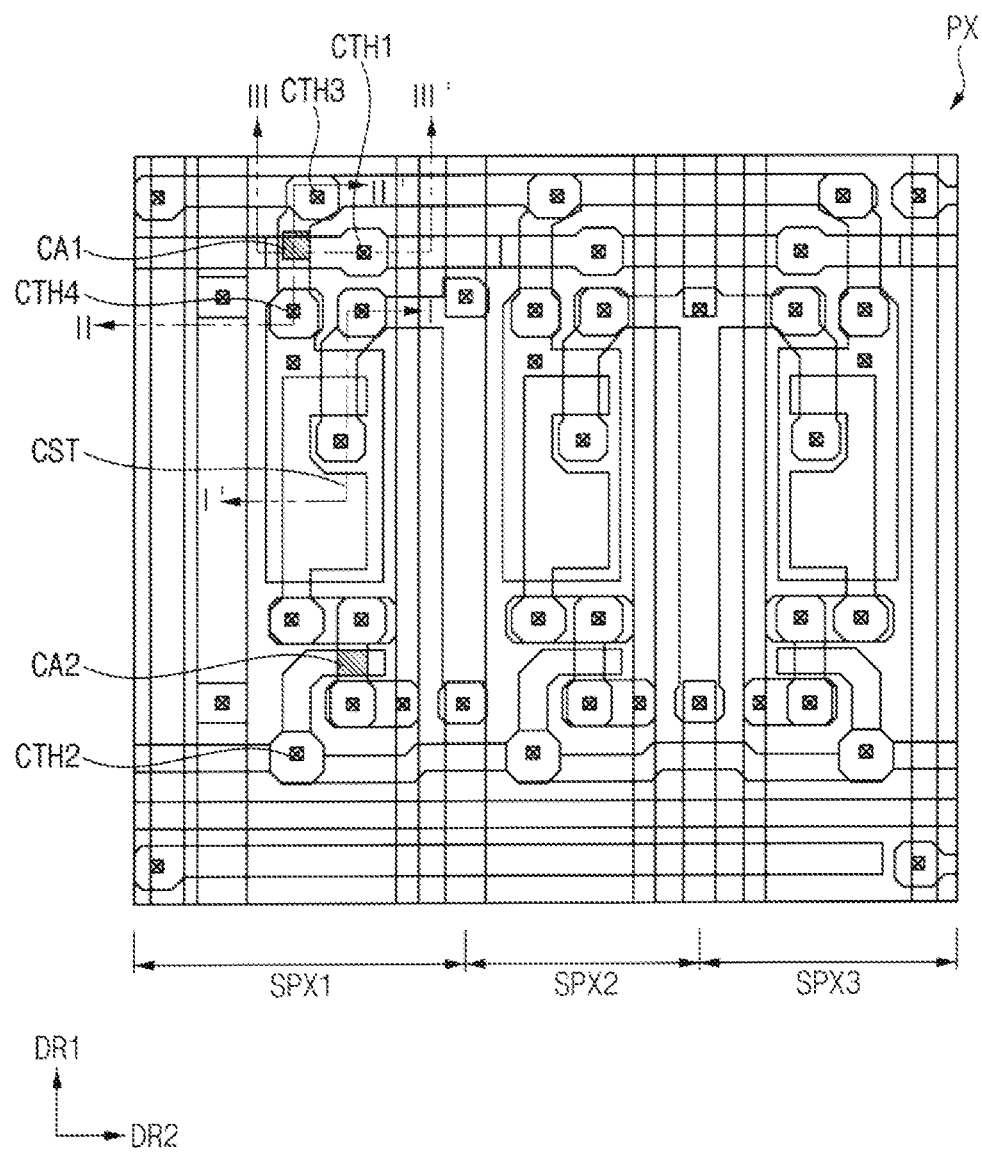
FIG. 3 is a layout view illustrating a pixel included in the display device of FIG. 1.

FIG. 3 is a layout view illustrating a pixel PX included in the display device 1000 of FIG. 1. For example, FIG. 3 may be an example of a plan view illustrating the circuit layer CL of FIG. 2. In other words, the light emitting diode LES of FIG. 2 may be disposed on the layout view illustrated in FIG. 3.

Referring to FIG. 3, the pixel PX may include sub-pixels SPX1, SPX2, and SPX3. For example, a first sub-pixel SPX1 may emit red light, a second sub-pixel SPX2 may emit green light, and a third sub-pixel SPX3 may emit blue light. However, a color of the light emitted by each of the sub-pixels SPX1, SPX2, and SPX3 is not limited. Although a case where there are three sub-pixels SPX1, SPX2, and SPX3 is illustrated, the disclosure is not limited thereto, and the pixel PX may include various numbers of sub-pixels. For example, the pixel PX may further include a fourth sub-pixel emitting white light.

Since the sub-pixels SPX1, SPX2, and SPX3 have the same component, one sub-pixel SPX1 will be described in detail below.

FIGS. 4 to 7 are layout views illustrating the components illustrated in FIG. 3 for each layer.

Figure 4:
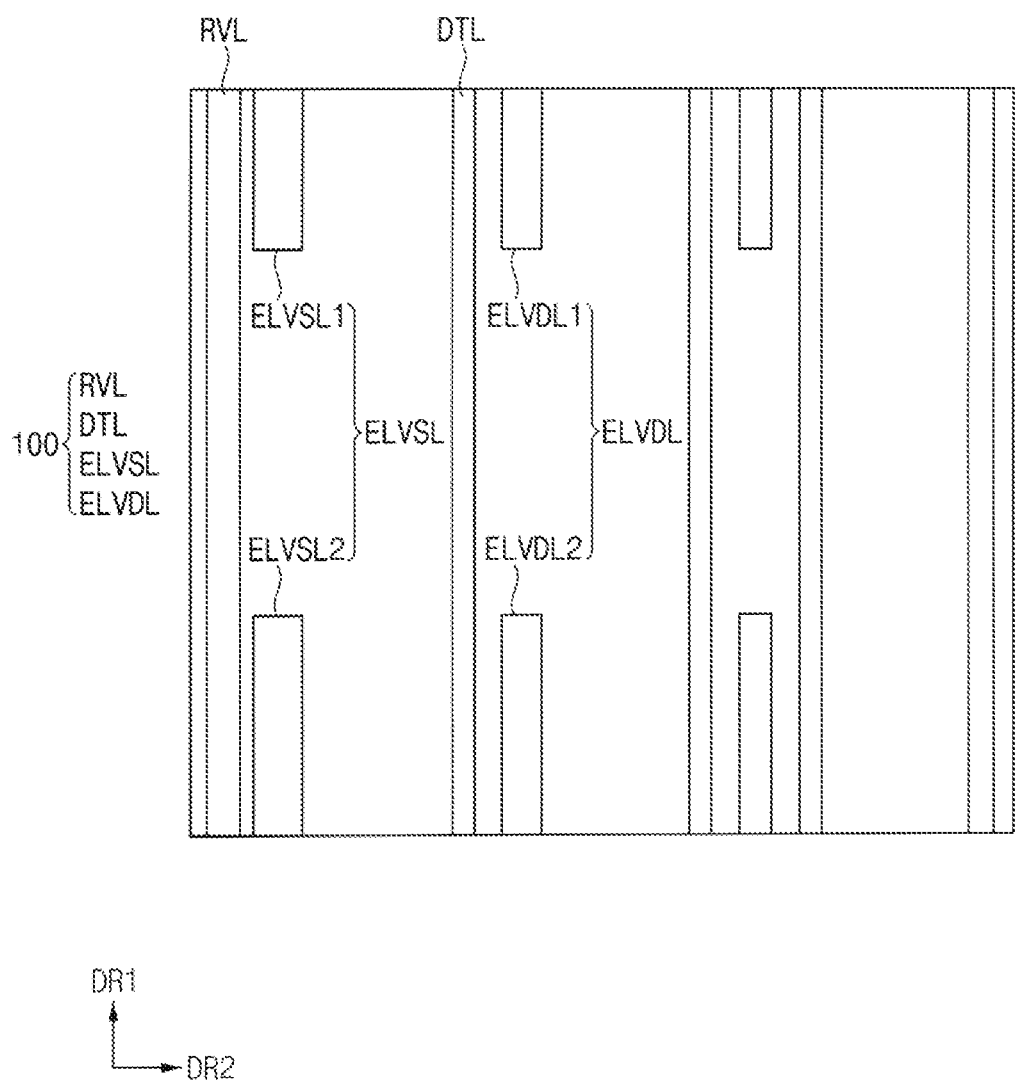
FIGS. 4 to 7 are layout views illustrating the components illustrated in FIG. 3 for each layer.

Referring to FIGS. 3 and 4, the display device 1000 may further include a data layer 100. The data layer 100 may be disposed on the substrate SUB.

The data layer 100 may include a high power line ELVDL, a low power line ELVSL, a reference voltage line RVL, and a data line DTL. The high power line ELVDL may include a first high power line ELVDL1 and a second high power line ELVDL2. The first and second high power lines ELVDL1 and ELVDL2 may be spaced apart from each other. The low power line ELVSL may include a first low power line ELVSL1 and a second low power line ELVSL2. The first and second low power lines ELVSL1 and ELVSL2 may be spaced apart from each other.

The data layer 100 may extend in the first direction DR1. The display device 1000 may include the data line DTL disposed on the substrate SUB, and the data line DTL may extend in the first direction DR1.

The high power line ELVDL may transmit a high potential voltage. The low power line ELVSL may transmit a low potential voltage. The reference voltage line RVL may transmit a reference potential voltage. The high potential voltage may be greater than the low potential voltage, and the reference potential voltage may be a preset voltage.

Figure 5:
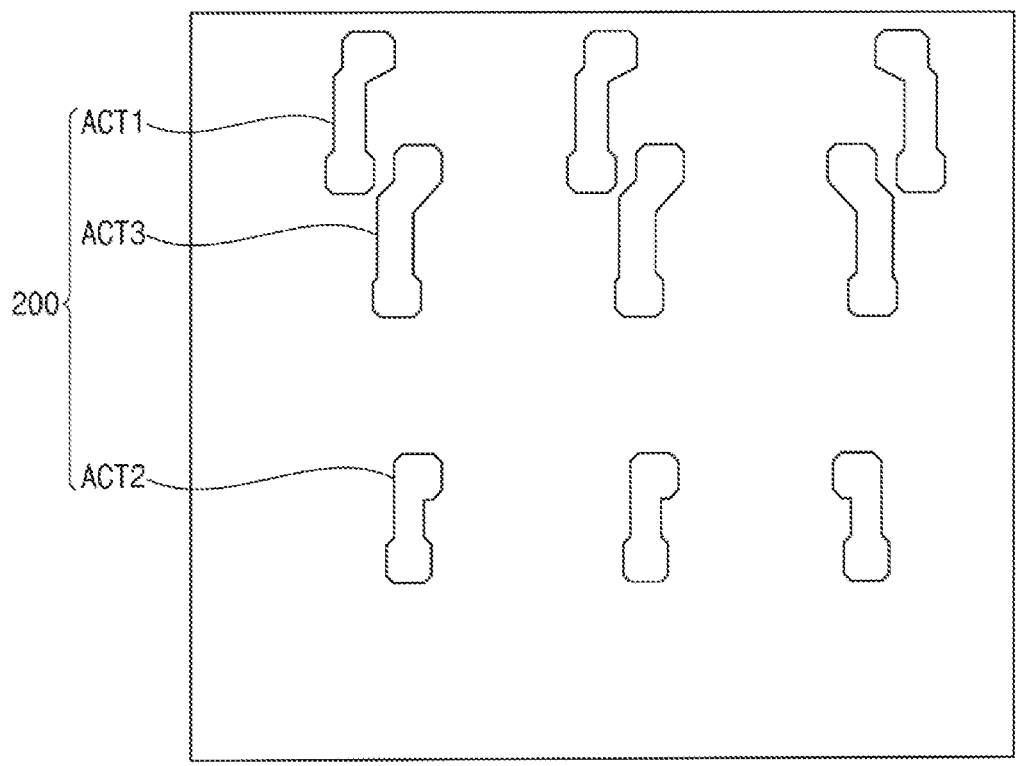

Referring to FIGS. 3 and 5, the display device 1000 may further include an active layer 200. The active layer 200 may be disposed on the data layer 100. A buffer layer may be disposed on the data layer 100, and the active layer 200 may be disposed on the buffer layer. The data line DTL may be disposed between the substrate SUB and the buffer layer.

The active layer 200 may include a first active pattern ACT1, a second active pattern ACT2, and a third active pattern ACT3. The first active pattern ACT1 may be disposed on the substrate SUB, and the second active pattern ACT2 and the third active pattern ACT3 may be disposed on a same layer as the first active pattern ACT1. Each of the first to third active patterns ACT1, ACT2, and ACT3 may extend in the first direction DR1. The first to third active patterns ACT1, ACT2, and ACT3 may be spaced apart from each other. Although a case where there are three active patterns ACT1, ACT2, and ACT3 (in one sub-pixel SPX1) is illustrated, the disclosure is not limited thereto, and the active layer 200 may include various numbers of active patterns.

Figure 6:
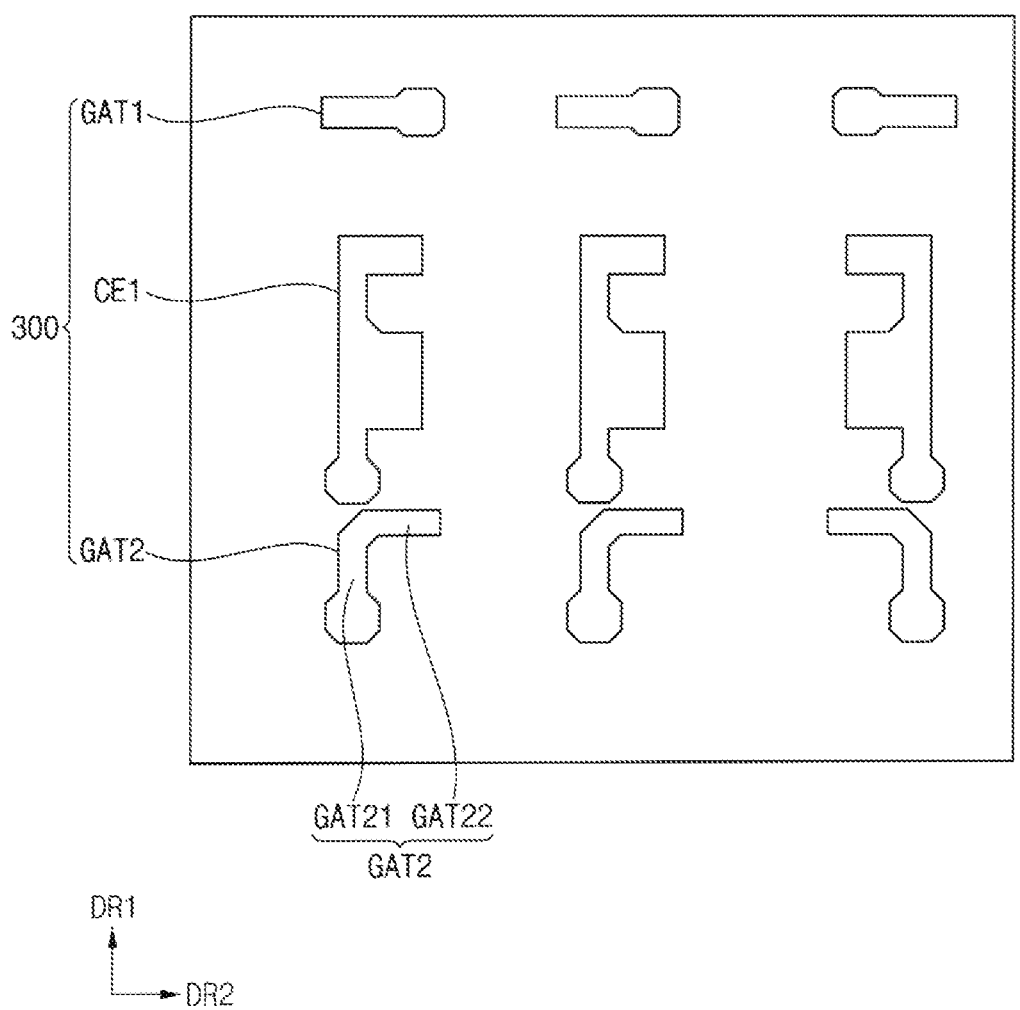

Referring to FIGS. 3 and 6, the display device 1000 may further include a gate layer 300. The gate layer 300 may be disposed on the active layer 200. A first insulating layer may be disposed on the active layer 200, and the gate layer 300 may be disposed on the first insulating layer.

The gate layer 300 may include a first gate electrode GAT1, a second gate electrode GAT2, and a first electrode CE1. The first gate electrode GAT1 may be disposed on the first active pattern ACT1, and the second gate electrode GAT2 and the first electrode CE1 may be disposed on a same layer as the first gate electrode GAT1.

The first gate electrode GAT1 may extend in the second direction DR2.

The second gate electrode GAT2 may include a first portion GAT21 and a second portion GAT22. The first portion GAT21 may extend in the first direction DR1. The second portion GAT22 may extend in the second direction DR2.

Figure 7:
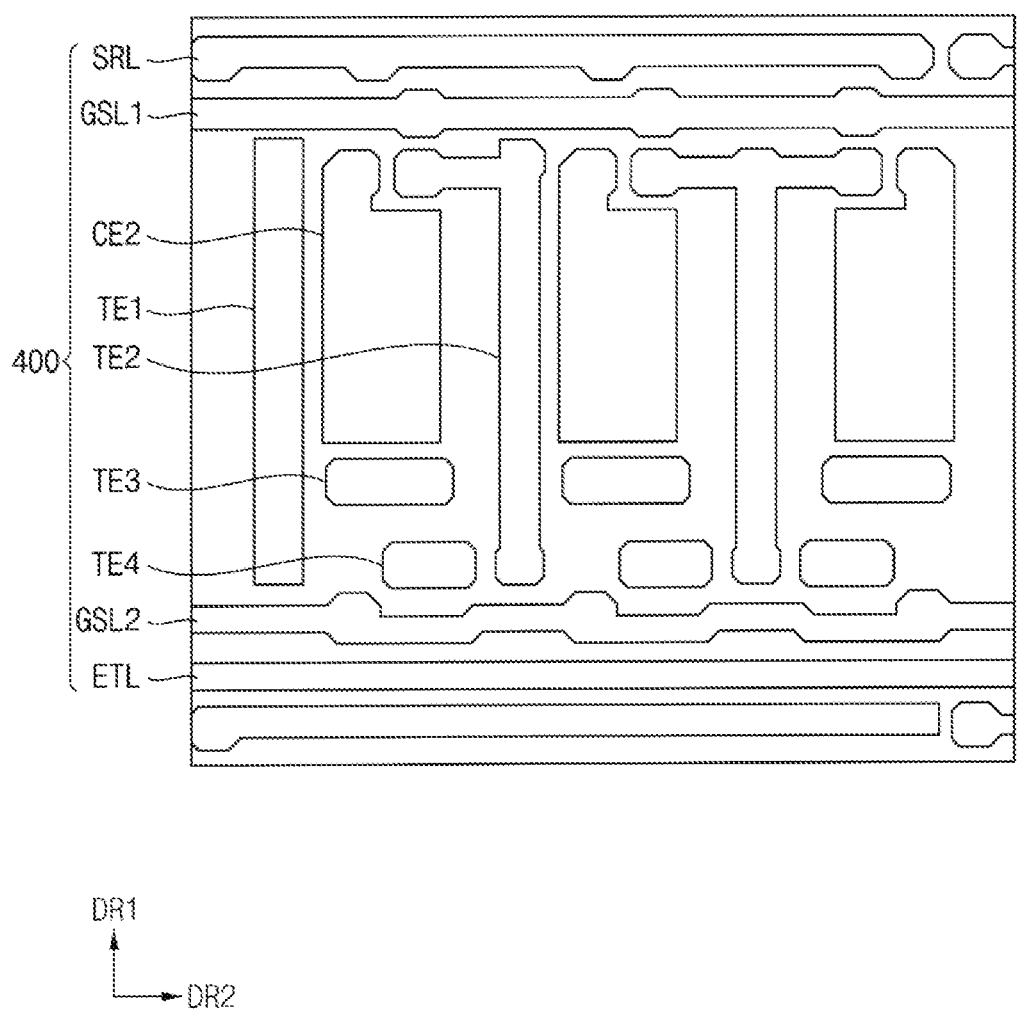

Referring to FIGS. 3 and 7, the display device 1000 may further include a source or drain layer 400. The source or drain layer 400 may be disposed on the gate layer 300. A second insulating layer may be disposed on the gate layer 300, and the source or drain layer 400 may be disposed on the second insulating layer.

The source or drain layer 400 may include a first gate signal line GSL1, a second gate signal line GSL2, a source line SRL, a second electrode CE2, an extension line ETL, and a first transfer electrode TE1, a second transfer electrode TE2, a third transfer electrode TE3, and a fourth transfer electrode TE4. The first gate signal line GSL1 may be disposed on the first gate electrode GAT1, and the second gate signal line GSL2, the source line SRL, the second electrode CE2, and the extension line ETL, the first transfer electrode TE1, the second transfer electrode TE2, the third transfer electrode TE3, and the fourth transfer electrode TE4 may be disposed on a same layer as the first gate signal line GSL1.

The light emitting diode LES illustrated in FIG. 2 may be disposed on the source or drain layer 400. The light emitting diode LES illustrated in FIG. 2 may be disposed on the first gate signal line GSL1 and may be disposed on the second gate signal line GSL2. The light emitting diode LES illustrated in FIG. 2 may be electrically connected to the source or drain layer 400 through a contact hole.

The first gate signal line GSL1, the second gate signal line GSL2, and the source line SRL may extend in the second direction DR2. The source line SRL may extend in a same direction as the first gate signal line GSL1.

Referring to FIGS. 3 to 7, the display device 1000 may further include a capacitor CST. The capacitor CST may include the first electrode CE1 and the second electrode CE2. The first electrode CE1 may be disposed within the gate layer 300. The first electrode CE1 may be disposed on a same layer as the first gate electrode GAT1. The second electrode CE2 may be disposed within the source or drain layer 400. The second electrode CE2 may be disposed on a same layer as the first gate signal line GSL1.

The first active pattern ACT1 and the first gate electrode GAT1 may overlap. The first active pattern ACT1 and the first gate electrode GAT1 may partially overlap. The first gate electrode GAT1 may be disposed to overlap the first active pattern ACT1, so that the first gate electrode GAT1 may define and form a first channel area CA1 that overlaps the first active pattern ACT1.

The second active pattern ACT2 and the second gate electrode GAT2 may overlap. The second active pattern ACT2 and the second gate electrode GAT2 may partially overlap. The second gate electrode GAT2 is disposed to overlap the second active pattern ACT2, so that the second gate electrode GAT2 may define and form a second channel area CA2 that overlaps the second active pattern ACT2.

The first gate signal line GSL1 may be disposed on the first gate electrode GAT1. The first gate signal line GSL1 may overlap the first channel area CA1. The first gate signal line GSL1 may overlap the first gate electrode GAT1 at least in the first channel area CA1.

The first gate electrode GAT1 and the first gate signal line GSL1 may extend in a same direction. The first active pattern ACT1 may extend in the first direction DR1, while the first gate electrode GAT1 and the first gate signal line GSL1 may extend in the second direction DR2 intersecting the first direction DR1. A length of the first gate signal line GSL1 may be longer than a length of the first gate electrode GAT1. The length extending in the second direction DR2 of the first gate signal line GSL1 may be longer than the length extending in the second direction DR2 of the first gate electrode GAT1.

The first gate signal line GSL1 may overlap the first gate electrode GAT1. The first gate signal line GSL1 may not overlap the first gate electrode GAT1 only in the first channel area CA1. All of the first gate electrode GAT1 may overlap the first gate signal line GSL1.

The first gate electrode GAT1 and the first gate signal line GSL1 may contain a conductive material. The first gate electrode GAT1 and the first gate signal line GSL1 may contain a same material or similar material. In an embodiment, the first gate electrode GAT1 and the first gate signal line GSL1 may contain copper (Cu). However, the material included in the first gate electrode GAT1 and the first gate signal line GSL1 is not limited to copper. The first gate electrode GAT1 and the first gate signal line GSL1 are not limited to containing a same material or similar material. For example, the first gate electrode GAT1 may contain copper, and the first gate signal line GSL1 may contain molybdenum (Mo).

The first gate signal line GSL1 may be electrically connected to the scan driver. The first gate signal line GSL1 may receive a signal from the scan driver.

The first gate signal line GSL1 may transmit a first gate signal to the first gate electrode GAT1. The first gate signal line GSL1 may receive the first gate signal from the scan driver and may transmit the first gate signal to the first gate electrode GAT1. The first gate signal may activate the first channel area CA1 of the first active pattern ACT1.

The second insulating layer may be disposed between the gate layer 300 and the source or drain layer 400. The second insulating layer may be disposed between the first gate electrode GAT1 and the first gate signal line GSL1.

The first gate signal line GSL1 may contact the first gate electrode GAT1 through a first contact hole CTH1 passing through the second insulating layer. The first gate signal line GSL1 may transmit the first gate signal to the first gate electrode GAT1. The first gate signal line GSL1 may transmit the first gate signal to the first channel area CA1. On the plane, the first contact hole CTH1 may be spaced apart from the first active pattern ACT1. The first contact hole CTH1 may not overlap the first active pattern ACT1.

The second gate signal line GSL2 may be disposed on the second gate electrode GAT2. On the plane, the second gate signal line GSL2 may be spaced apart from the second channel area CA2. The second gate signal line GSL2 may not overlap the second channel area CA2. On the plane, the second gate signal line GSL2 and the second gate electrode GAT2 may overlap in an area spaced apart from the second channel area CA2. A portion of the second gate electrode GAT2 (the first portion GAT21 of FIG. 6) may overlap the second gate signal line GSL2, and the portion of the second gate electrode GAT2 may not overlap the second channel area CA2. Another portion of the second gate electrode GAT2 (the second portion GAT22 of FIG. 6) may overlap the second channel area CA2.

The second gate electrode GAT2 may include the second portion GAT22 extending in a same direction as the second gate signal line GSL2 and the first portion GAT21 extending in a different direction from the second gate signal line GSL2. The extending direction of the first portion GAT21 may intersect the extending direction of the second portion GAT22. The first portion GAT21 may extend in the first direction DR1 in which the second active pattern ACT2 extends, and the second portion GAT22 may extend in the second direction DR2 which the second gate signal line GSL2 extends. The first and second portions GAT21 and GAT22 may contact each other to form one second gate electrode GAT2. In other words, the second gate electrode GAT2 may have a curved shape or a substantially curved shape.

The second gate electrode GAT2 and the second gate signal line GSL2 may contain a conductive material. The second gate electrode GAT2 and the second gate signal line GSL2 may contain a same material or similar material. In an embodiment, the second gate electrode GAT2 and the second gate signal line GSL2 may contain copper (Cu). However, the material included in the second gate electrode GAT2 and the second gate signal line GSL2 is not limited to copper. The second gate electrode GAT2 and the second gate signal line GSL2 are not limited to containing a same material or similar material. For example, the second gate electrode GAT2 may contain copper, and the second gate signal line GSL2 may contain molybdenum (Mo).

The second gate signal line GSL2 may be electrically connected to the scan driver. The second gate signal line GSL2 may receive a signal from the scan driver.

The second gate signal line GSL2 may transmit a second gate signal to the second gate electrode GAT2. The second gate signal line GSL2 may receive the second gate signal from the scan driver and may transmit the second gate signal to the second gate electrode GAT2. The second gate signal may activate the second channel area CA2 of the second active pattern ACT2.

The second insulating layer may be disposed between the gate layer 300 and the source or drain layer 400. The second insulating layer may be disposed between the second gate electrode GAT2 and the second gate signal line GSL2.

The second gate signal line GSL2 may contact the second gate electrode GAT2 through a second contact hole CTH2 passing through the second insulating layer. The second gate signal line GSL2 may transmit the second gate signal to the second gate electrode GAT2. The second gate signal line GSL2 may contact the first portion GAT21 of the second gate electrode GAT2 through the second contact hole CTH2, and the first portion GAT21 may contact the second portion GAT22 of the second gate electrode GAT2. The second gate signal line GSL2 may transmit the second gate signal to the second channel area CA2. The second contact hole CTH2 may not overlap the second active pattern ACT2.

The source line SRL may contact the first active pattern ACT1. A portion of the source line SRL in contact with the first active pattern ACT1 may be defined as a source electrode.

The first insulating layer may be disposed between the active layer 200 and the gate layer 300. The second insulating layer may be disposed between the gate layer 300 and the source or drain layer 400. The first and second insulating layers may be disposed between the first active pattern ACT1 and the source line SRL.

The source line SRL may contact the first active pattern ACT1 through a third contact hole CTH3 passing through the first and second insulating layers. The source line SRL may be electrically connected to the first active pattern ACT1 through the third contact hole CTH3 penetrating the first and second insulating layers. The third contact hole CTH3 may overlap the first active pattern ACT1.

The second electrode CE2 may be disposed on the first electrode CE1. A portion of the second electrode CE2 may not overlap the first electrode CE1.

The first transfer electrode TE1 may be disposed on the first and second low power lines ELVSL1 and ELVSL2. The first transfer electrode TE1 may electrically connect the first and second low power lines ELVSL1 and ELVSL2 through a contact hole.

The second transfer electrode TE2 may be disposed on the first and second high power lines ELVDL1 and ELVDL2. The second transfer electrode TE2 may electrically connect the first and second high power lines ELVDL1 and ELVDL2 through a contact hole. A portion of the second transfer electrode TE2 may be branched in the first direction DR1 to overlap the third active pattern ACT3. The portion of the second transfer electrode TE2 may be electrically connected to the third active pattern ACT3 through a contact hole. The second transfer electrode TE2 may be electrically connected to the second electrode CE2 through the third active pattern ACT3.

The third transfer electrode TE3 may overlap the second active pattern ACT2 and the first electrode CE1. The third transfer electrode TE3 may electrically connect the second active pattern ACT2 and the first electrode CE1 through the contact holes.

The fourth transfer electrode TE4 may overlap the data line DTL and the second active pattern ACT2. The fourth transfer electrode TE4 may electrically connect the data line DTL and the second active pattern ACT2 through the contact holes.

The extension line ETL may extend in the second direction DR2. The extension line ETL may overlap the data layer 100.

Hereinafter, a description will be given with reference to cross-section views to show a stacking order of the display device 1000.

Figure 8:
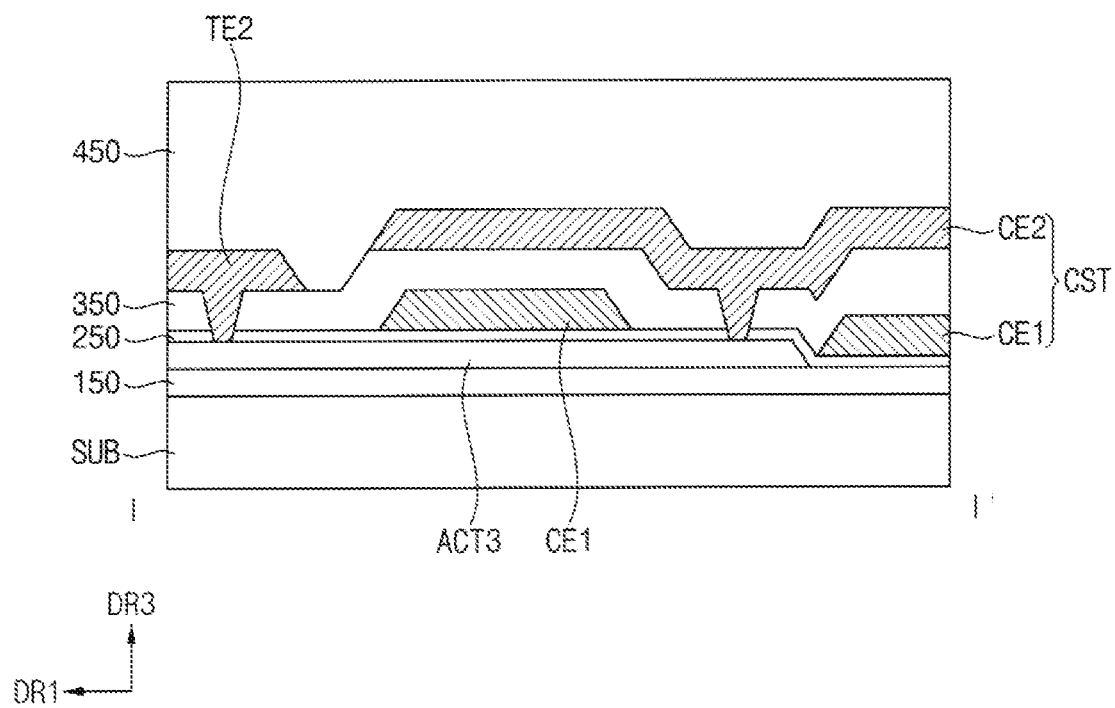
FIG. 8 is a schematic cross-sectional view taken along line I-I' of FIG. 3.

FIG. 8 is a schematic cross-sectional view taken along line I-I' of FIG. 3.

Referring to FIGS. 3 and 8, the buffer layer 150 may be disposed on the substrate SUB. The buffer layer 150 may prevent diffusion of impurities from the substrate SUB to the active layer 200. The buffer layer 150 may control a transfer rate of heat generated in a process of forming the active layer 200. The active layer 200 may be uniformly formed.

The third active pattern ACT3 of the active layer 200 may be disposed on the buffer layer 150. The active layer 200 may include a semiconductor material. Examples of the semiconductor material include amorphous silicon, polycrystalline silicon, oxide semiconductor, or the like within the spirit and the scope of the disclosure. The third active pattern ACT3 may include one selected from the group consisting of amorphous silicon, polycrystalline silicon, and an oxide semiconductor.

The first insulating layer 250 may be disposed on the active layer 200. The first insulating layer 250 may be disposed on the third active pattern ACT3. The first insulating layer 250 may insulate the active layer 200 and the gate layer 300. The first insulating layer 250 may include an inorganic insulating material. Examples of the inorganic insulating material include silicon oxide, silicon nitride, titanium oxide, and tantalum oxide. These may be used alone or in combination with each other.

The gate layer 300 may be disposed on the first insulating layer 250. The first electrode CE1 of the gate layer 300 may be disposed on the first insulating layer 250. The gate layer 300 may contain one selected from the group consisting of a metal and a metal oxide. Examples of the metal include silver, molybdenum, aluminum, tungsten, copper, nickel, chromium, titanium, tantalum, platinum, scandium, and indium. These may be used alone or in combination with each other. Examples of the metal oxide include indium tin oxide, indium zinc oxide, and indium tin zinc oxide. These may be used alone or in combination with each other. In an embodiment, the first electrode CE1 may contain copper.

The second insulating layer 350 may be disposed on the gate layer 300. The second insulating layer 350 may be disposed on the first electrode CE1. The second insulating layer 350 may insulate the gate layer 300 and the source or drain layer 400. The second insulating layer 350 may include an inorganic insulating material. Examples of the inorganic insulating material include silicon oxide, silicon nitride, titanium oxide, and tantalum oxide. These may be used alone or in combination with each other.

The source or drain layer 400 may be disposed on the second insulating layer 350. The second electrode CE2 of the source or drain layer 400 may be disposed on the second insulating layer 350. The source or drain layer 400 may contain one selected from the group consisting of metals and metal oxides. In an embodiment, the source or drain layer 400 may contain a same material or similar material as the gate layer 300. The second electrode CE2 may contain copper. A portion of the first electrode CE1 and the second electrode CE2 overlapping the first electrode CE1 may form the capacitor CST.

Referring to FIGS. 2 and 8, the third insulating layer 450 may be disposed on the source or drain layer 400. The third insulating layer 450 may insulate the source or drain layer 400 and the light emitting diode LES. The third insulating layer 450 may include an organic insulating material. Examples of the organic insulating material include photoresists, polyacrylic resins, and polyimide resins. These may be used alone or in combination with each other.

Figure 9:
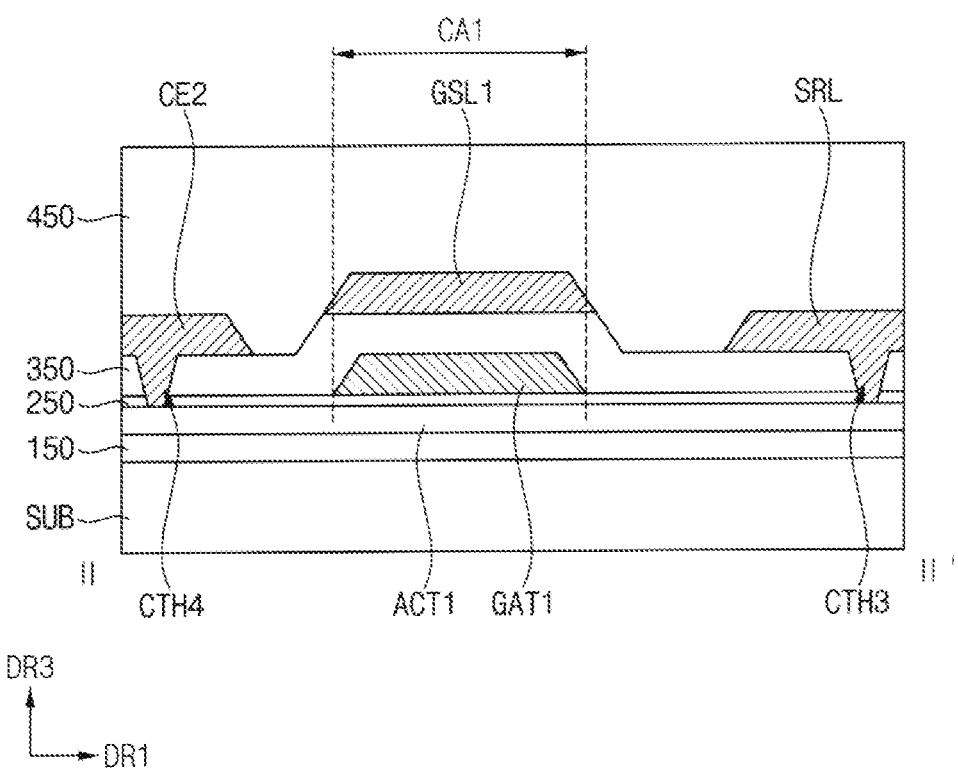
FIG. 9 is a schematic cross-sectional view taken along line II-II' of FIG. 3.

FIG. 9 is a schematic cross-sectional view taken along line II-II' of FIG. 3. The same reference numerals are used for the same components as in FIG. 8, and duplicate descriptions of the same components will be omitted.

Referring to FIGS. 3 and 9, the first active pattern ACT1 of the active layer 200 may be disposed on the buffer layer 150. The first gate electrode GAT1 may be disposed on the first active pattern ACT1. The first gate electrode GAT1 may form and define the first channel area CA1 in an area overlapping the first active pattern ACT1.

The source line SRL of the source or drain layer 400 may contact the first active pattern ACT1 through the third contact hole CTH3. The source line SRL overlapping the first active pattern ACT1 may serve as the source electrode. The second electrode CE2 of the source or drain layer 400 may contact the first active pattern ACT1 through the fourth contact hole CTH4. The second electrode CE2 overlapping the first active pattern ACT1 may serve as a drain electrode. The first gate signal line GSL1 of the source or drain layer 400 may overlap the first active pattern ACT1 and the first gate electrode GAT1. The first gate signal line GSL1 may overlap the first gate electrode GAT1 in the first channel area CA1. However, the first gate signal line GSL1 may not contact the first gate electrode GAT1 in the first channel area CA1.

Figure 10:
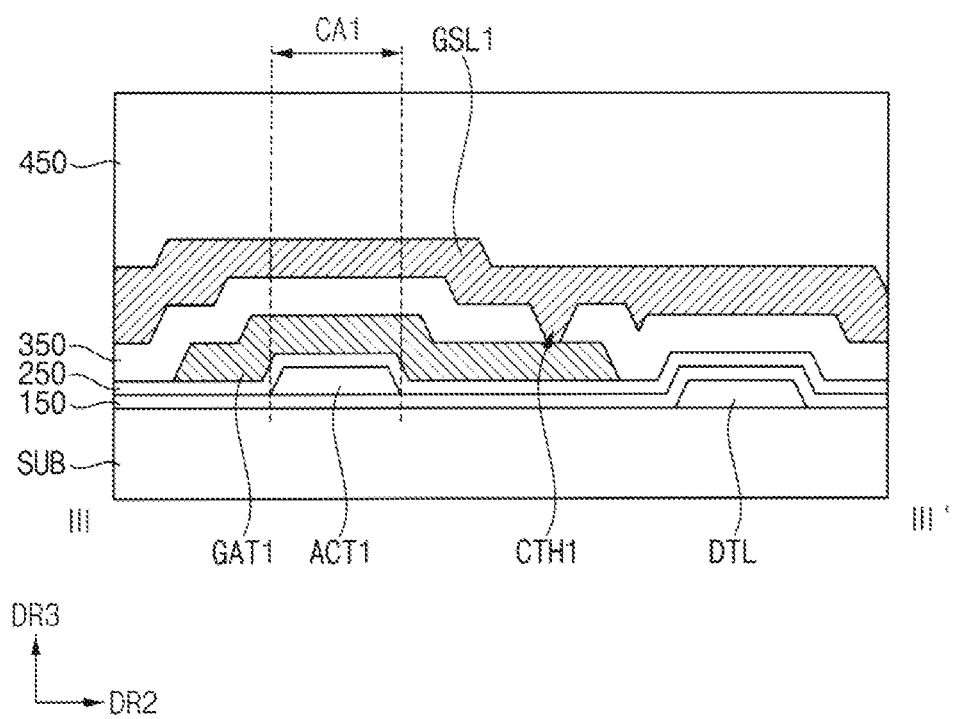
FIG. 10 is a schematic cross-sectional view taken along line III-III' of FIG. 3.

FIG. 10 is a schematic cross-sectional view taken along line III-III' of FIG. 3. The same reference numerals are used for the same components as in FIGS. 8 and 9, and duplicate descriptions of the same components will be omitted.

Referring to FIGS. 3 and 10, the data line DTL may be disposed on the substrate SUB. The buffer layer 150 may be disposed on the data line DTL.

The first gate electrode GAT1 of the gate layer 200 may extend in the second direction DR2. The first gate signal line GSL1 of the source or drain layer 400 may extend in the second direction DR2. The first gate electrode GAT1 and the first gate signal line GSL1 may extend in a same direction. An extended length of the first gate signal line GSL1 may be longer than an extended length of the first gate electrode GAT1. All of the first gate electrode GAT1 may overlap the first gate signal line GSL1.

The first gate signal line GSL1 may contact the first gate electrode GAT1 through the first contact hole CTH1. The first gate signal line GSL1 may be electrically connected to the first gate electrode GAT1 through the first contact hole CTH1. The first gate signal line GSL1 may transmit the first gate signal to the first gate electrode GAT1.

A planar area for a line that transmits the first gate signal to the first gate electrode GAT1 is needed. Since the first gate electrode GAT1 and the first gate signal line GSL1 overlap and extend in a same direction, the efficiency of the area of the pixel PX may be improved. For example, the total area of the pixel PX may be reduced. The pixel per inch (PPI) of the pixel PX may be increased. The resolution of the display device 1000 may be increased. For example, the display quality of the display device 1000 may be improved.

Although embodiments and implementations have been described herein, other embodiments and modifications will be apparent from the description. Accordingly, the disclosure is not limited to the described embodiments, but rather to the broader scope of the disclosure and various modifications and equivalent arrangements as would be apparent to a person of ordinary skill in the art.

What is claimed is:

1. A display device comprising:
   an active pattern disposed on a substrate;
   a gate electrode disposed on the active pattern and defining a channel area in an area overlapping the active pattern in a plan view;
   a gate signal line disposed on the gate electrode, overlapping the channel area in a plan view, and transmitting a gate signal to the gate electrode; and
   a light emitting diode disposed on the gate signal line, wherein
   each of the gate signal line and the gate electrode have a longest dimension that extends in a same direction.

2. The display device of claim 1, wherein the gate signal line overlaps the gate electrode in a plan view.

3. The display device of claim 1, wherein the gate electrode and the gate signal line extend in a same direction.

4. The display device of claim 1, wherein
   the active pattern extends in a first direction, and
   the gate electrode and the gate signal line extend in a second direction intersecting the first direction.

5. The display device of claim 1, further comprising:
   an insulating layer disposed between the gate electrode and the gate signal line, and
   wherein the gate signal line electrically contacts the gate electrode through a contact hole penetrating the insulating layer.

6. The display device of claim 5, wherein the contact hole is spaced apart from the active pattern in a plan view.

7. The display device of claim 1, further comprising:
   a source line electrically contacting the active pattern,
   wherein the source line and the gate signal line are disposed on a same layer.

8. The display device of claim 7, wherein the source line and the gate signal line extend in a same direction.

9. The display device of claim 7, further comprising:
   a first insulating layer disposed between the active pattern and the gate electrode; and
   a second insulating layer disposed between the gate electrode and the gate signal line, and
   wherein the source line is electrically connected to the active pattern through a contact hole penetrating the first insulating layer and the second insulating layer.

10. The display device of claim 1, further comprising:
    a capacitor including:
      a first electrode, the first electrode and the gate electrode being disposed on a same layer; and
      a second electrode, the second electrode and the gate signal line being disposed on a same layer.

11. The display device of claim 1, wherein a length of the gate signal line is longer than a length of the gate electrode.

12. The display device of claim 1, wherein the gate electrode and the gate signal line contain a same material.

13. The display device of claim 1, wherein the gate electrode and the gate signal line contain copper.

14. The display device of claim 1, wherein
    the light emitting diode includes:
      a pixel electrode;
      an intermediate layer; and
      a counter electrode, and
    the pixel electrode, the intermediate layer, and the counter electrode are disposed sequentially on the gate signal line.

15. The display device of claim 1, further comprising:
    a data line disposed between the substrate and the active pattern, wherein
    the data line extends in a first direction, and
    the gate electrode extends in a second direction intersecting the first direction.

16. A display device comprising:
    a first active pattern disposed on a substrate;
    a second active pattern disposed on a same layer as the first active pattern;
    a first gate electrode disposed on the first active pattern and defining a first channel area in an area overlapping the first active pattern in a plan view;
    a second gate electrode defining a second channel area in an area overlapping the second active pattern in a plan view, the second gate electrode and the first gate electrode being disposed on a same layer;
    a first gate signal line disposed on the first gate electrode, overlapping the first channel area in a plan view, and transmitting a first gate signal to the first gate electrode;
    a second gate signal line transmitting a second gate signal to the second gate electrode, the second gate signal line and the first gate signal line being disposed on a same layer; and
    a light emitting diode disposed on the first gate signal line and the second gate signal line, wherein
    each of the gate signal line and the gate electrode have a longest dimension that extends in a same direction.

17. The display device of claim 16, wherein the first active pattern and the second active pattern are spaced apart from each other.

18. The display device of claim 16, wherein the second gate signal line is spaced apart from the second channel area in a plan view.

19. The display device of claim 16, wherein
    all of the first gate electrode overlaps the first gate signal line in a plan view, and
    a portion of the second gate electrode overlaps the second gate signal line in a plan view.

20. The display device of claim 16, wherein
    the second gate electrode is L-shaped and includes a first portion extending in a first direction and a second portion extending in a second direction intersecting the first direction, and
    the first gate electrode, the first gate signal line, and the second gate signal line extend in the second direction.

21. The display device of claim 1, wherein the active pattern is spaced apart from the substrate in a direction corresponding to a thickness direction of the substrate.

22. The display device of claim 5, wherein the contact hole is spaced apart from the active pattern in a horizontal direction that is perpendicular to a thickness direction of the display device.

* * * * *